United States Patent
Zeng et al.

(10) Patent No.: US 10,784,163 B2
(45) Date of Patent: Sep. 22, 2020

(54) MULTI-WAFER STACKING STRUCTURE AND FABRICATION METHOD THEREOF

(71) Applicant: Wuhan Xinxin Semiconductor Manufacturing Co., Ltd., Hubei (CN)

(72) Inventors: Tian Zeng, Hubei (CN); Changlin Zhao, Hubei (CN)

(73) Assignee: Wuhan Xinxin Semiconductor Manufacturing Co., Ltd., Wuhuan, Hubei (CN)

( * ) Notice: Subject to any disclaimer, the term of this patent is extended or adjusted under 35 U.S.C. 154(b) by 0 days.

(21) Appl. No.: 16/234,988

(22) Filed: Dec. 28, 2018

(65) Prior Publication Data

US 2020/0075411 A1  Mar. 5, 2020

(30) Foreign Application Priority Data

Aug. 28, 2018 (CN) .......................... 2018 1 0988427

(51) Int. Cl.
*H01L 21/768* (2006.01)
*H01L 23/48* (2006.01)
*H01L 27/06* (2006.01)
*H01L 21/288* (2006.01)

(52) U.S. Cl.
CPC .... *H01L 21/76898* (2013.01); *H01L 21/2885* (2013.01); *H01L 21/7684* (2013.01); *H01L 21/76804* (2013.01); *H01L 21/76877* (2013.01); *H01L 23/481* (2013.01); *H01L 27/0688* (2013.01)

(58) Field of Classification Search
CPC ......... H01L 21/76898; H01L 21/76804; H01L 21/76877; H01L 21/76802; H01L 23/481; H01L 23/5226; H01L 23/5283; H01L 27/0688
See application file for complete search history.

(56) References Cited

U.S. PATENT DOCUMENTS

| | | | |
|---|---|---|---|
| 2020/0075457 A1* | 3/2020 | Hu | H01L 21/306 |
| 2020/0075549 A1* | 3/2020 | Zhao | H01L 21/76898 |
| 2020/0075550 A1* | 3/2020 | Ye | H01L 23/562 |
| 2020/0075552 A1* | 3/2020 | Zhao | H01L 21/76805 |

* cited by examiner

*Primary Examiner* — Laura M Menz
*Assistant Examiner* — Candice Chan
(74) *Attorney, Agent, or Firm* — Muncy, Geissler, Olds & Lowe, P.C.

(57) ABSTRACT

A multi-wafer stacking structure and a fabrication method thereof are disclosed. A first dielectric layer and a second dielectric layer are bonded to each other, a first interconnection layer is electrically connected with a second metal layer and a first metal layer via a first opening; a third dielectric layer and an insulating layer are bonded to each other, and a second interconnection layer is electrically connected with a third metal layer and the first interconnection layer via a second opening. Reservation of a pressure welding lead space among wafers is not needed, a silicon substrate is omitted, multi-wafer stacking thickness is reduced while interconnection of multiple pieces of wafers is realized, and therefore, the overall thickness of the device after multi-wafer stacking and packaging is reduced, packaging density is increased, and the requirement of thinning of the semiconductor products is met.

13 Claims, 8 Drawing Sheets

MULTI-WAFER STACKING STRUCTURE AND FABRICATION METHOD THEREOF

CROSS-REFERENCE TO RELATED APPLICATION

This application claims the priority of Chinese patent application number 201810988427.5, filed on Aug. 28, 2018, the entire contents of which are incorporated herein by reference.

TECHNICAL FIELD

The present invention belongs to the technical field of integrated circuit manufacture, and particularly relates to a multi-wafer stacking structure and a fabrication method thereof.

BACKGROUND

Under the tendency of development of highly integrated semiconductors, after multi-wafer stacking, a manner of lead bonding is generally adopted to realize interconnection among multiple wafers. Specifically, multiple wafers are stacked along a vertical direction on a special silicon substrate. Each wafer has multiple bonding pads used for interconnection, a plurality of sharing bonding pads are arranged on the silicon substrate. One end of each of leads is bonded to a corresponding one of the bonding pads of the wafer in a pressure welding manner, and the other end of each of the leads are bonded to a corresponding one of the sharing bonding pads of the silicon substrate in an integrated pressure welding manner, so as to realize interconnection among the multiple wafers.

But the inventor finds that some problems exist in the traditional multi-wafer lead interconnection manner. Firstly, there are certain restrictions on the thickness of the wafers with the development of multi-wafer stacking towards high density. As a pressure welding lead space needs to be reserved among multiple wafers adopting lead bonding, the silicon substrate itself has a certain thickness, and the overall thickness after multi-wafer stacking is relatively great to a certain extent. In addition, gold wires are generally adopted as the leads, and therefore, the cost is relatively high. Moreover, the silicon substrate cannot be adapted to the requirement on more and more sharing bonding pads for high-density development of the multi-wafer stacking.

SUMMARY OF THE INVENTION

One objective of the present invention is to provide a multi-wafer stacking structure, so as to reduce the overall thickness after multi-wafer stacking.

Another objective of the present invention is that neither lead nor silicon substrate is needed, and thus being favorable for reducing the cost and simplifying the process.

In order to solve the technical scheme, the present invention provides a multi-wafer stacking structure, including:

a first wafer, wherein the first wafer includes a first substrate, a first dielectric layer and a first metal layer;

a second wafer, wherein the second wafer includes a second substrate, a second dielectric layer and a second metal layer, and the first dielectric layer and the second dielectric layer are bonded to each other;

a first opening, wherein the first opening penetrates through the first substrate, the first dielectric layer and a partial thickness of the second dielectric layer, the first opening at least exposing part of the second metal layer and part of the first metal layer;

a first interconnection layer, wherein the first interconnection layer is electrically connected with the second metal layer and the first metal layer via the first opening;

an insulating layer, wherein the insulating layer is located on the surfaces of the first substrate and the first interconnection layer;

a third wafer, wherein the third wafer includes a third substrate, a third dielectric layer and a third metal layer, the third dielectric layer and the insulating layer are bonded to each other;

a second opening, wherein the second opening penetrates through the third substrate, the third dielectric layer and the insulating layer, and exposes part of the first interconnection layer and part of the third metal layer; and a second interconnection layer, wherein the second interconnection layer is electrically connected with the third metal layer and the first interconnection layer via the second opening.

The present invention also provides a fabrication method of the multi-wafer stacking structure, including:

providing a first wafer and a second wafer which are bonded to each other, wherein the first wafer includes a first substrate, a first dielectric layer and a first metal layer, the second wafer including a second substrate, a second dielectric layer and a second metal layer, the first dielectric layer facing the second dielectric layer;

forming a first opening, wherein the first opening penetrates through the first substrate, the first dielectric layer and a partial thickness of the second dielectric layer, and the first opening at least exposing part of the second metal layer and part of the first metal layer;

forming a first interconnection layer, wherein the first interconnection layer is electrically connected with the second metal layer and the first metal layer via the first opening;

forming an insulating layer, wherein the insulating layer is located on surfaces of the first substrate and the interconnection layer;

providing a third wafer, wherein the third wafer includes a third substrate, a third dielectric layer and a third metal layer, the third dielectric layer and the insulating layer being bonded to each other;

forming a second opening, wherein the second opening penetrates through the third substrate, the third dielectric layer and the insulating layer, the second opening exposing part of the first interconnection layer and part of the third metal layer; and forming a second interconnection layer, wherein the second interconnection layer is electrically connected with the third metal layer and the first interconnection layer via the second opening.

The present invention provides the multi-wafer stacking structure and the fabrication method thereof; the first dielectric layer and the second dielectric layer are bonded to each other, the first interconnection layer is electrically connected with the second metal layer and the first metal layer via the first opening; the third dielectric layer and the insulating layer are bonded to each other, and the second interconnection layer is electrically connected with the third metal layer and the first interconnection layer via the second opening. According to the present invention, reservation of a pressure welding lead space among the wafers is not needed, the silicon substrate is omitted, and multi-wafer stacking thickness is reduced while interconnection of multiple wafers is realized, and therefore, the overall thickness of the device after multi-wafer stacking and packaging is reduced, packaging density is increased, and the requirement of thinning of the semiconductor products is met. Furthermore, lead is not needed for the semiconductor device any more, and therefore, design and processing of the silicon substrate and a plurality of sharing bonding pads on the silicon substrate are omitted, reduction of cost is benefited, and the process is simplified.

Figure 1:
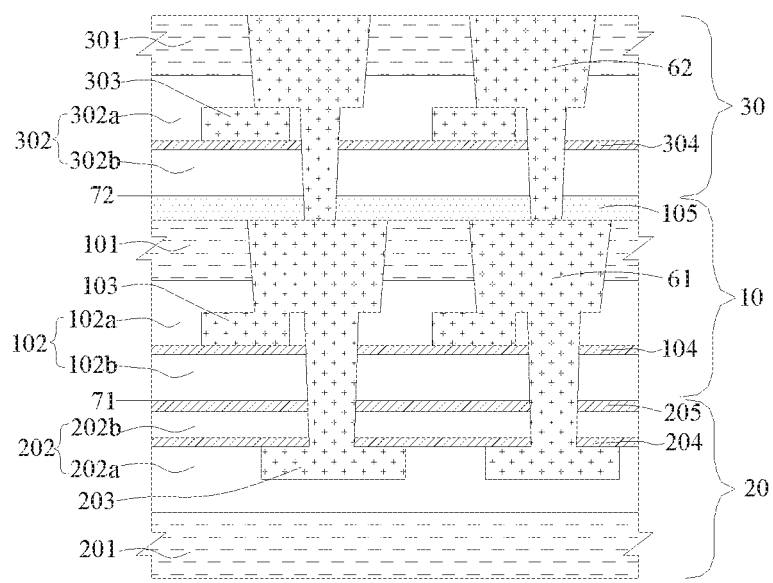
FIG. 1 is a diagrammatic cross-section of a multi-wafer stacking structure according to an embodiment of the present invention.

wherein reference numbers in the drawings are as follows:
10—first wafer; 101—first substrate; 102—first dielectric layer; 103—first metal layer; 104—passivation layer; 105—insulating layer; 102a—first portion of first dielectric layer; 102b—second portion of first dielectric layer;
20—second wafer; 201—second substrate; 202—second dielectric layer; 203—second metal layer; 204—second etching stopping layer; 205—passivation layer; 202a—first portion of second dielectric layer; 202b—second portion of second dielectric layer;
30—third wafer; 301—third substrate; 302—third dielectric layer; 303—third metal layer; 304—passivation layer; 302a—first portion of third dielectric layer; 302b—second portion of third dielectric layer;
41—first opening; 41a—first lower opening; 41b—first upper opening; 42—second opening; 42a—second lower opening; 42b—second upper opening;
50—filling layer; 80—photoresist; 61—first interconnection layer; 62—second interconnection layer; 71—first bonding interface; 72—second bonding interface.

DETAILED DESCRIPTION OF EXEMPLARY EMBODIMENTS

Further detailed description will be made to the manufacture method of the semiconductor device and the semiconductor device provided by the present invention in combination with the drawings and specific embodiments below. According to introductions below, the advantages and characteristics of the present invention will be more clear. It should be explained that all drawings adopt simplified forms and all use very accurate proportion, which are only used for conveniently and clearly state the objectives of the embodiments of the present invention as an aid.

Figure 10:
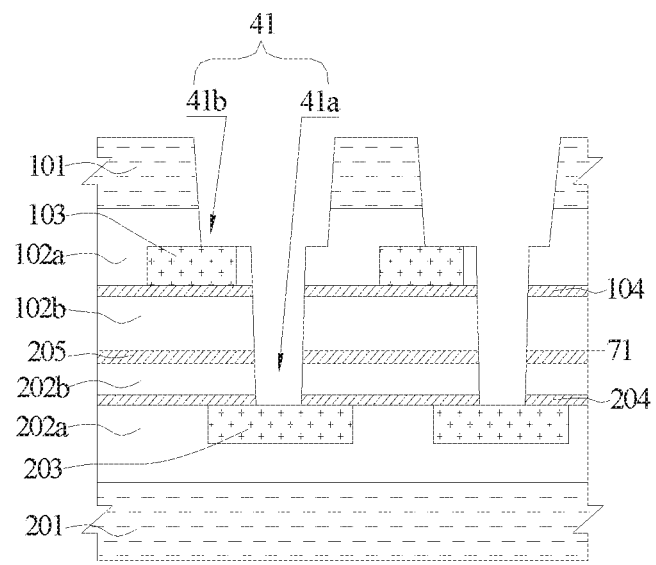
FIG. 10 is a diagrammatic cross-section after removal of the filling layer according to the embodiment of the present invention.
Figure 14:
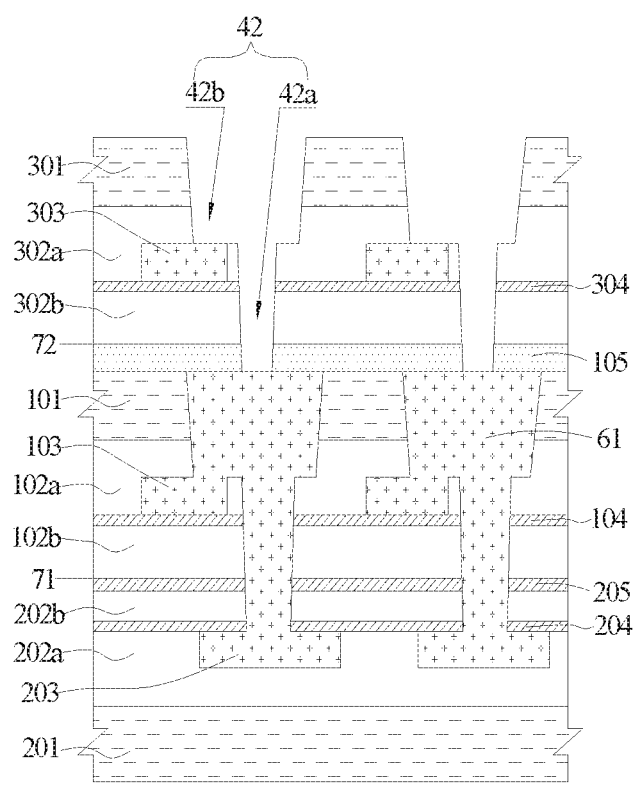
FIG. 14 is a diagrammatic cross-section after forming of a second opening according to the embodiment of the present invention.

The embodiment of the present invention provides a multi-wafer stacking structure, as shown in FIGS. 1, 10 and 14, including:

a first wafer 10, wherein the first wafer 10 includes a first substrate 101, a first dielectric layer 102 and a first metal layer 103;

a second wafer 20, wherein the second wafer 20 includes a second substrate 201, a second dielectric layer 202 and a second metal layer 203, and the first dielectric layer 102 is bonded to the second dielectric layer 202 such that a first bonding interface 71 is formed;

a first opening 41, wherein the first opening 41 penetrates through the first substrate 101, the first dielectric layer 102 and a partial thickness of the second dielectric layer 202, and the first opening 41 at least exposes a part surface of the second metal layer 203 and a part surface of the first metal layer 103;

a first interconnection layer 61, wherein the first interconnection layer 61 is electrically connected with the second metal layer 203 and the first metal layer 103 via the first opening 41;

an insulating layer 105, wherein the insulating layer 105 is formed on the surfaces of the first substrate 101 and the first interconnection layer 61;

a third wafer 30, wherein the third wafer 30 includes a third substrate 301, a third dielectric layer 302 and a third metal layer 303. The third dielectric layer 302 is bonded to the insulating layer 105 such that a second bonding interface 72 is formed;

a second opening 42, wherein the second opening 42 penetrates through the third substrate 301, the third dielectric layer 302 and the insulating layer 105. The second opening 42 exposes a part surface of the first interconnection layer 61 and a part surface of the third metal layer 303; and a second interconnection layer 62, wherein the second interconnection layer 62 is electrically connected with the third metal layer 303 and the first interconnection layer 61 via the second opening 42.

In order to reduce the overall thickness after interconnection of multiple wafers, after the bonding of the first dielectric layer 102 and the second dielectric layer 202, the first wafer 10 and/or the second wafer 20 may be thinned. And after the bonding of the third dielectric layer 302 and the insulating layer 105, the third wafer 30 may be thinned.

Preferably, as shown in FIG. 10, the first opening 41 includes:

a first lower opening 41a, wherein the first lower opening 41a penetrates through the first substrate 101, the first dielectric layer 102 and a partial thickness of the second dielectric layer 202. The first lower opening 41a exposes a part surface of the second metal layer 203; and a first upper opening 41b, wherein the first upper opening 41b penetrates through the first substrate 101 and partial thickness of the first dielectric layer 102, and the first upper opening 41b exposes a part surface of the first metal layer 103.

The first lower opening 41a is communicated with the first upper opening 41b so as to form the first opening 41.

Preferably, as shown in FIG. 14, the second opening 42 includes:

a second lower opening 42a, wherein the second lower opening 42a penetrates through the third substrate 301, the third dielectric layer 302 and the insulating layer 105, and the second lower opening 42a exposes a part surface of the first interconnection layer 61; and a second upper opening 42b, wherein the second upper opening 42b penetrates through the third substrate 301 and a partial thickness of the third dielectric layer 302, and the second upper opening 42b exposes a part surface of the third metal layer 303.

The second lower opening 42a is communicated with the second upper opening 42b so as to form the second opening 42.

Preferably, as shown in FIG. 1, the first dielectric layer 102 includes a first portion 102a and a second portion 102b. The first metal layer 103 is embedded between the first portion 102a and the second portion 102b of the first dielectric layer 102. The second dielectric layer 202 includes a first portion 202a and a second portion 202b. The second metal layer 203 is embedded between the first portion 202a and the second portion 202b of the second dielectric layer 202. The third dielectric layer 302 includes a first portion 302a and a second portion 302b. The third metal layer 303 is embedded between the first portion 302a and the second portion 302b of the third dielectric layer 302.

The first wafer 10 further includes a passivation layer 104. The passivation layer 104 is located between the first metal layer 103 and the second portion 102b of the first dielectric layer 102. The second wafer 20 further includes a second etching stopping layer 204. The second etching stopping layer 204 is located between the second metal layer 203 and the second portion 202b of the second dielectric layer 202. The third wafer 30 further includes a passivation layer 304. The passivation layer 304 is located between the third metal layer 303 and the second portion 302b of the third dielectric layer 302.

Figure 2:
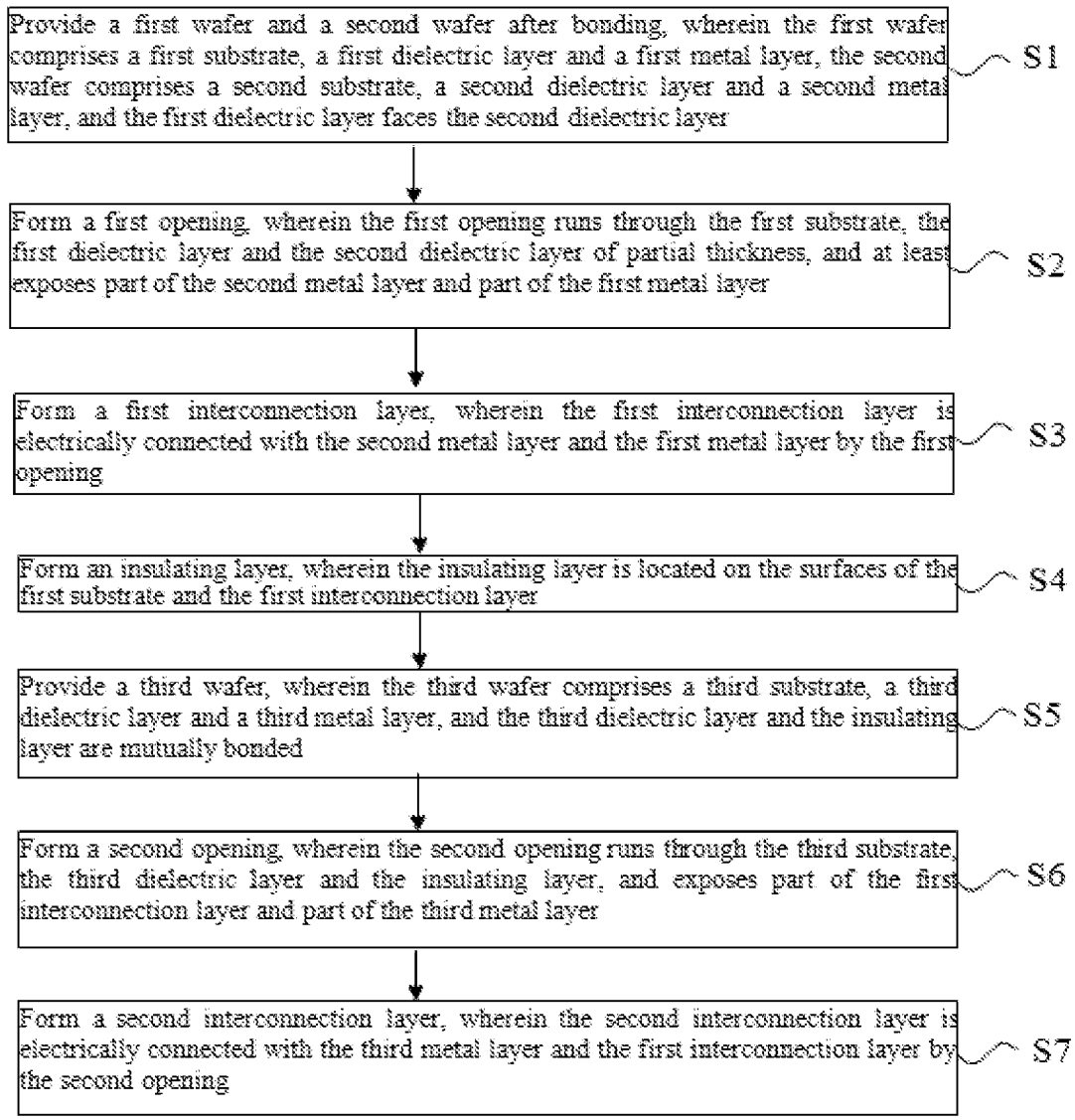
FIG. 2 is a flow diagram of a fabrication method of the multi-wafer stacking structure according to the embodiment of the present invention.

The embodiment of the present invention provides a fabrication method of the multi-wafer stacking structure, as shown in FIG. 2, including:

providing a first wafer 10 and a second wafer 20 which are bonded to each other, wherein the first wafer 10 includes a first substrate 101, a first dielectric layer 102 and a first metal layer 103; the second wafer 20 includes a second substrate 201, a second dielectric layer 202 and a second metal layer 203; and the first dielectric layer 102 faces the second dielectric layer 202;

forming a first opening 41, wherein the first opening 41 penetrates through the first substrate 101, the first dielectric layer 102 and partial thickness of the second dielectric layer 202, and the first opening 41 at least exposes a part surface of the second metal layer 203 and a part surface of the first metal layer 103;

forming a first interconnection layer 61, wherein the first interconnection layer 61 is electrically connected with the second metal layer 203 and the first metal layer 103 via the first opening 41;

forming an insulating layer 105, wherein the insulating layer 105 is formed on the surfaces of the first substrate 101 and the first interconnection layer 61;

providing a third wafer 30. Wherein the third wafer includes a third substrate 301, a third dielectric layer 302 and a third metal layer 303, and the third dielectric layer 302 and the insulating layer 105 are bonded to each other;

forming a second opening 42, wherein the second opening 42 penetrates through the third substrate 301, the third dielectric layer 302 and the insulating layer 105, and the second opening 42 exposes a part surface of the first interconnection layer 61 and a part surface of the third metal layer 303; and forming a second interconnection layer 62, wherein the second interconnection layer 62 is electrically connected with the third metal layer 303 and the first interconnection layer 61 via the second opening 42.

It should be noted that it is not limited in the present invention that which one of the first wafer and the second wafer must be placed above/below, instead, the position of an upper wafer and a lower wafer can be interchanged. For the sake of brevity and convenience in description herein, only one position relation of the two wafers is shown, and a person skilled in the art may understand that all technical contents described herein are also applicable to the condition that the positions of "the first wafer" and "the second wafer" are turned upside down, at the moment, the position relation of all layers of the stacked semiconductor device is also turned upside down correspondingly. In some circumstances, preferably, during the period of performing bonding processing on two wafers, the wafer with relatively great wafer bow is placed below. However, in such a condition, after wafer bonding is ended, whether to turn upside down can be determined according to actual requirements, so as to determine which one of the wafer is located above and which one of the wafer is located below.

Is should be noticed that, herein, serial numbers including "first", "second", "third", "fourth" and the like are only used for the sake of distinguishing all different parts or processes with same names, instead of indicating sequence or position relation, etc. In addition, for all parts with same names, for example, "the first substrate" and "the second substrate", "the first dielectric layer" and "the second dielectric layer", etc., it does not mean that they all have the same structure or component. For example, although it is not shown in the figures, in a vast majority of circumstances, parts formed in "the first substrate" and "the second substrate" are different, and the structure of the substrates may also be different. In some embodiments, the substrate may be a semiconductor substrate, and is made from any semiconductor material (such as Si, SiC, SiGe, etc.) suitable for the semiconductor device. In other embodiments, the substrate may also be silicon on insulator (SOI), silicon germanium on insulator or other various composite substrates. A person skilled in the art may understand that the substrate is not subjected to any limitation, instead, it may be selected according to actual application. Various device (not limited to the semiconductor device) components (not shown in the figures) may be formed in the substrate. Other layers or components may be already formed in the substrate, for example, a gate structure, a contact hole, a dielectric layer, a metal line and a through hole etc.

The fabrication method of the multi-wafer stacking structure provided by the embodiment of the present invention will be described in details hereafter in combination with what are shown in FIG. 3 to FIG. 14 and FIG. 1.

Figure 3:
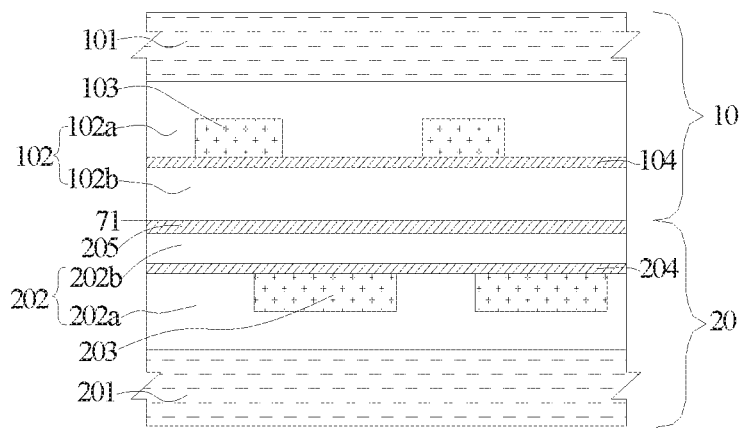
FIG. 3 is a schematic diagram after bonding of two wafers according to the embodiment of the present invention.

As shown in FIG. 3, a first wafer 10 and a second wafer 20 bonded to each other are provided. Wherein the first wafer 10 includes the first substrate 101, the first dielectric layer 102 and the first metal layer 103. The second wafer 20 includes the second substrate 201, the second dielectric layer 202 and the second metal layer 203. The first dielectric layer 102 faces the second dielectric layer 202. The two wafers are bonded by utilizing the intermolecular chemical force of a bonding dielectric layer interface film to form a first bonding interface 71.

Further, the first dielectric layer 102 includes a first portion 102a and a second portion 102b. The first metal layer 103 is embedded between the first portion 102a and the second portion 102b of the first dielectric layer 102. The second dielectric layer 202 includes a first portion 202a and a second portion 202b. The second metal layer 203 is embedded between the first portion 202a and the second portion 202b of the second dielectric layer 202.

Further, the first wafer 10 further includes a passivation layer 104, wherein the passivation layer 104 is located between the first metal layer 103 and the second portion 102b of the first dielectric layer 102. The second wafer 20 further includes a second etching stopping layer 204, wherein the second etching stopping layer 204 is located between the second metal layer 203 and the second portion 202b of the second dielectric layer 202. The second wafer 20 further includes a passivation layer 205 located on the surface of the second portion 202b of the second dielectric layer 202. The passivation layer 205, for example, is a silicon nitride layer, which is configured to protect the surface of the second wafer 20. And in the present embodiment, the passivation layer 205 is in contact with the second portion 102b of the first dielectric layer 102 such that the first bonding interface 71 is formed.

Preferably, after bonding of the first and second wafers, the first wafer 10 and/or the second wafer 20 may be thinned, so as to reduce the overall thickness of the device. On one hand, the first opening 41 is easy to be formed after thinning, and on the other hand, reduction of the overall thickness of the wafer after bonding is favorable for highly integration of the wafer.

Figure 4:
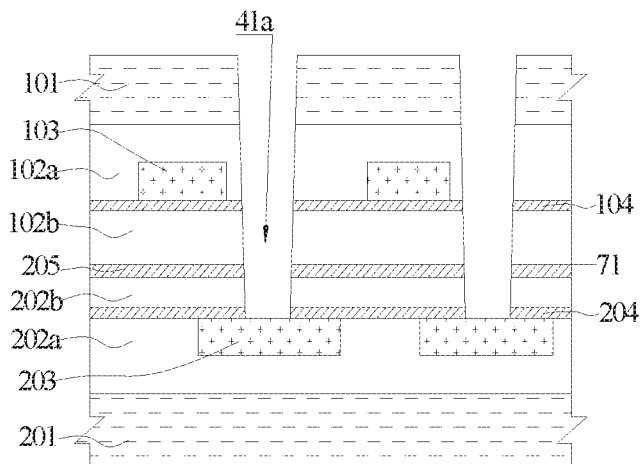
FIG. 4 is a diagrammatic cross-section after forming of a first lower opening according to the embodiment of the present invention.

Then, as shown in FIG. 4, a plurality of first lower openings 41a are formed by etching, and the first lower openings 41a penetrate through the first substrate 101, the first dielectric layer 102 and a partial thickness of the second dielectric layer 202. The first lower openings 41a are located above the surface of the second metal layer 203, i.e., expose a part surface of the second metal layer 203.

Figure 5:
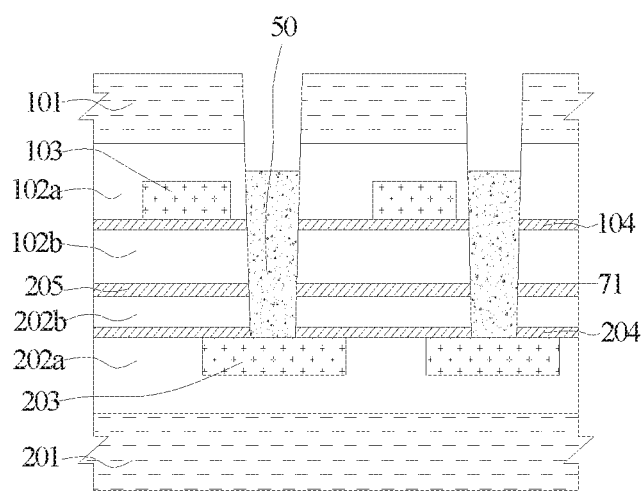
FIG. 5 is a diagrammatic cross-section after forming of a filling layer according to the embodiment of the present invention.

Further, as shown in FIG. 5, the filling layer 50 is formed, and the first lower openings 41a are filled with the filling layer 50 so as to protect the exposed a part surface of the second metal layer 203 in the subsequent etching process.

Lastly, the re-etching process is performed to thin the filling layer 50 until that an upper top surface of the filling layer 50 is not lower than an upper top surface of the first metal layer 103.

An organic solvent BARC (Bottom Anti-reflective Coating) with good mobility is optimally selected for the filling layer 50.

Figure 6:
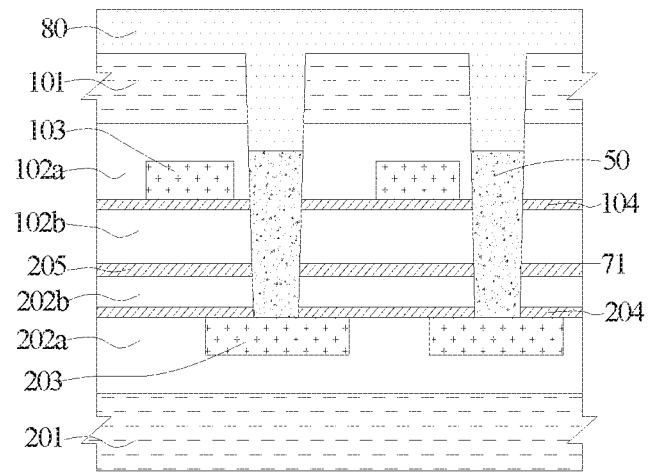
FIG. 6 is a diagrammatic cross-section after coating of photoresist according to the embodiment of the present invention.
Figure 7:
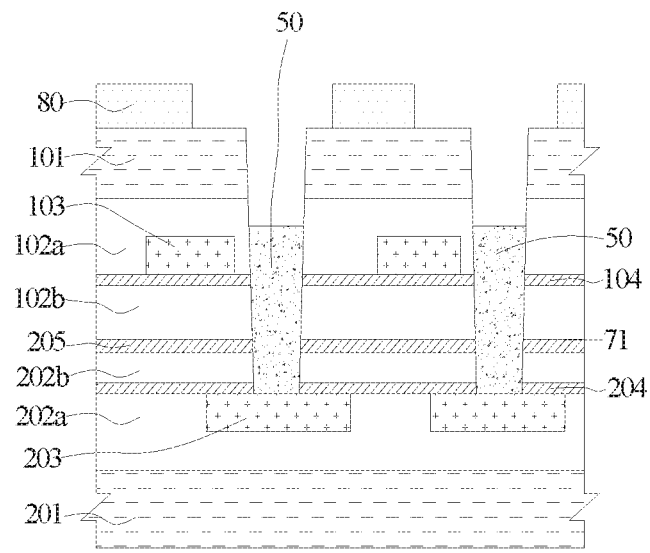
FIG. 7 is a diagrammatic cross-section after patterning of the photoresist according to the embodiment of the present invention.

Further, as shown in FIG. 6 and FIG. 7, photoresist 80 is coated, the space above the filling layer 50 in the first lower openings 41a are filled with the photoresist 80, and the back of the first substrate 101 is covered with the photoresist 80.

Afterwards, the photoresist 80 in the first lower openings 41a is removed by exposure and development, and a photoresist opening which is located above part of the first metal layer 103 and the second metal layer 203 is formed on the back of the first substrate 101.

Figure 8:
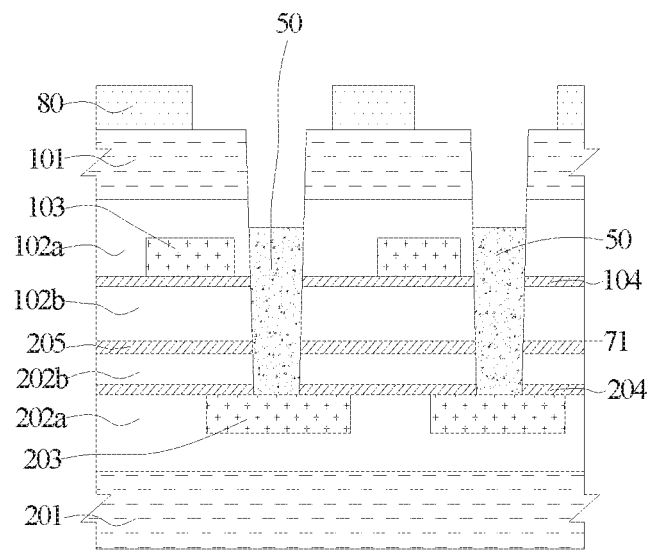
FIG. 8 is a diagrammatic cross-section after forming of a first upper opening according to the embodiment of the present invention.
Figure 9:
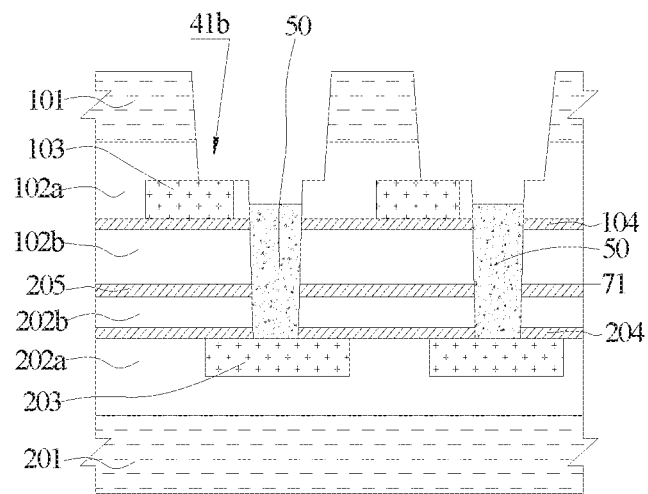
FIG. 9 is a diagrammatic cross-section after removal of the photoresist according to the embodiment of the present invention.

Further, as shown in FIG. 8 and FIG. 9, a plurality of first upper openings 41b are formed by etching using the remaining photoresist 80 as a mask. The first upper openings 41b penetrate through the first substrate 101 and a partial thickness of the first dielectric layer 102, and the first upper openings 41b expose part of the first metal layer 103. In the etching process, the filling layer 50 is also etched slightly. The width of the cross sections of the first upper openings 41b is greater than the width of the cross sections of the first lower openings 41a (the cross section referred herein means a section sectioned by being vertical to the first wafer and the second wafer). The first upper openings 41b expose a part surface of the first metal layer 103, and each first lower opening 41a is communicated with the corresponding first upper opening 41b, so as to form the first opening 41. Afterwards, as shown in FIG. 9, the photoresist 80 on the back of the first substrate 101 is removed.

Further, as shown in FIG. 10, re-etching is performed to remove the filling layer 50 in the first lower openings 41a. In the present embodiment, the first upper openings 41b and the first lower openings 41a each has a cross section of inverted trapezoid.

Figure 11:
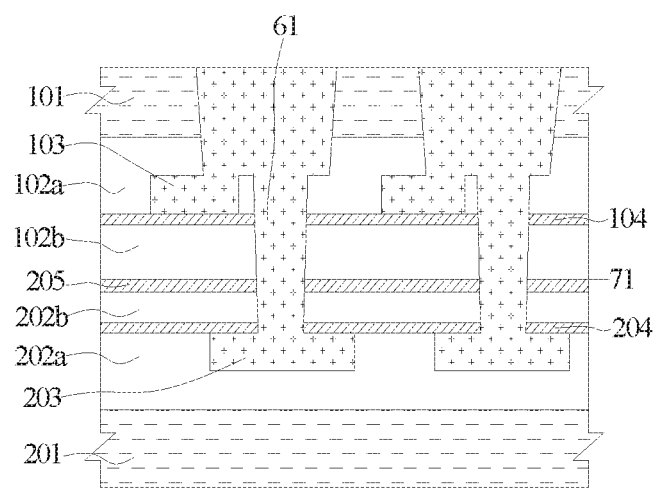
FIG. 11 is a diagrammatic cross-section after forming of a first interconnection layer according to the embodiment of the present invention.

Further, as shown in FIG. 11, the first interconnection layer 61 is formed, and the first interconnection layer 61 is electrically connected with the second metal layer 203 and the first metal layer 103 via the first lower openings 41a and the first upper openings 41b. The first interconnection layer 61 is a conducting material, and can be made of copper or copper alloy. The first lower openings 41a and the first upper openings 41b can be filled by a copper plating manner to cover the surface of the first substrate 101, and then a chemical and mechanical polishing and planarization treatment are performed.

Figure 12:
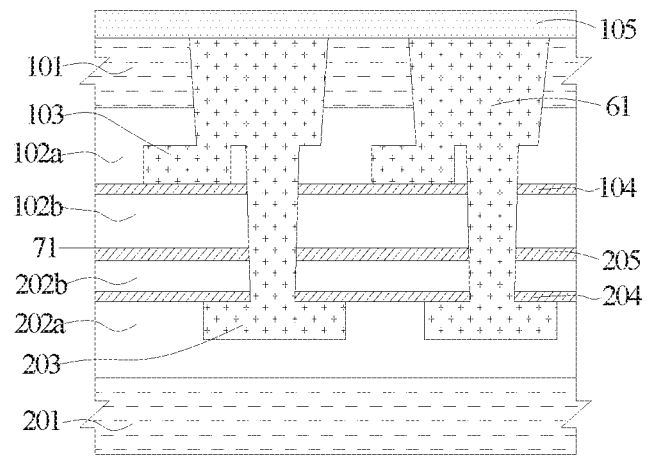
FIG. 12 is a diagrammatic cross-section after forming of an insulating layer according to the embodiment of the present invention.

Further, as shown in FIG. 12, the insulating layers 105 are formed on the surfaces of the first substrate 101 and the first interconnection layer 61.

Figure 13:
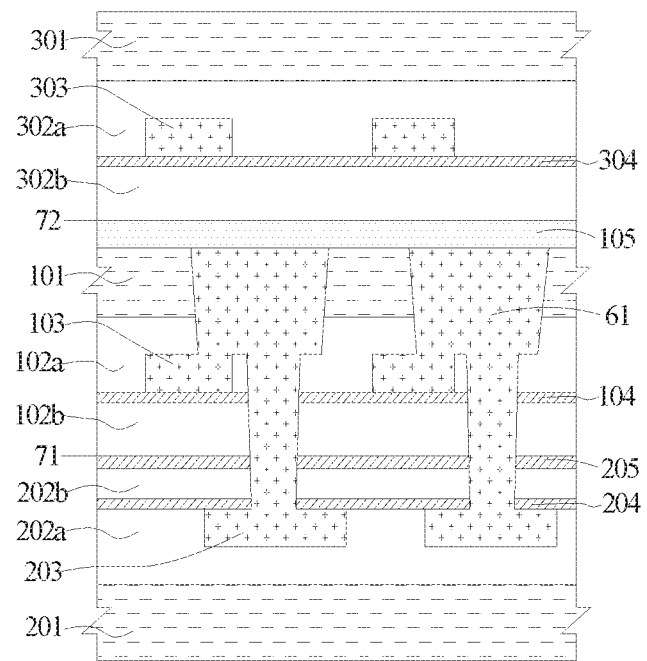
FIG. 13 is a diagrammatic cross-section after bonding of a third wafer according to the embodiment of the present invention.

Further, as shown in FIG. 13, the third wafer 30 is provided. Wherein the third wafer includes a third substrate 301, a third dielectric layer 302 and a third metal layer 303. Further, the third dielectric layer 302 includes a first portion 302a and a second portion 302b. The third metal layer 303 is embedded between the first portion 302a and the second portion 302b of the third dielectric layer 302. Further, the third wafer 30 further includes a passivation layer 304, and the passivation layer 304 is located between the third metal layer 303 and the second portion 302b of the third dielectric layer 302.

The first wafer 10 and the third wafer 30 are aligned, so that the third dielectric layer 302 and the insulating layers 105 are bonded to each other.

Further, as shown in FIG. 14, the second opening 42 is formed. Firstly, the second lower openings 42a are formed by etching, and the second lower openings 42a penetrate through the third substrate 301, the third dielectric layer 302 and the insulating layers 105. The second lower openings 42a are located above the surface of the first interconnection layer 61 and expose a part surface of the first interconnection layer 61.

In addition, the second upper openings 42b are formed by adopting the method the same as that for forming the plurality of first upper openings 41b by etching. The second upper openings 42b penetrate through the third substrate 301 and partial thickness of the third dielectric layer 302, and the second upper openings 42b expose part of the third metal layer 303.

Each second lower opening 42a is communicated with the corresponding second upper opening 42b, so as to form the second opening 42.

Further referring to FIG. 1, the second interconnection layer 62 is formed, and the second interconnection layer 62 is electrically connected with the third metal layer 303 and the first interconnection layer 61 via the second opening 42, so as to realize interconnection of the first wafer, the second wafer and the third wafer. The wafer stacking structure can be repeated for multiple times according to actual requirements, so as to realize multi-wafer stacking and interconnection of a higher density under the limitation of the multi-wafer interconnection overall thickness requirement, and finally, the device after multi-wafer stacking has stronger functions.

To sum up, according to the multi-wafer stacking structure and the method disclosed by the present invention, reservation of a pressure welding lead space among wafers is not needed, the silicon substrate is omitted, and the multi-wafer stacking thickness is reduced while multi-wafer interconnection is realized, so that the thickness of the overall device after multi-wafer stacking and packaging is reduced, the packaging density is increased, more wafers are accommodated in unit volume, and the increasing thinning requirement of the semiconductor products is met. Furthermore, no lead is needed any more, design and processing of the silicon substrate and a plurality of sharing bonding pads on the silicon substrate are omitted, the cost is reduced, and the process is simplified. Therefore, the wafer integration capacity is improved, wafers (for example, RF, Memory, Logic, Sensors, Imagers) of different functions are integrated on one packaging body, and then tremendous advantage can be provided in the aspects of performance, function and size.

The foregoing descriptions are only descriptions of preferred embodiments of the present invention, and are not intended to limit the scope of the present invention, and any alteration or modification made by a person of ordinary skill in the art according to the disclosure contents should fall within the protection scope of the claims.

What is claimed is:

1. A multi-wafer stacking structure, comprising:
   a first wafer comprising a first substrate, a first dielectric layer and a first metal layer;
   a second wafer comprising a second substrate, a second dielectric layer and a second metal layer, the first dielectric layer and the second dielectric layer being bonded to each other;
   a first opening penetrating through the first substrate, the first dielectric layer and a partial thickness of the second dielectric layer, the first opening at least exposing part of the second metal layer and part of the first metal layer;
   a first interconnection layer, electrically connected with the second metal layer and the first metal layer via the first opening;
   an insulating layer, located on surfaces of the first substrate and the first interconnection layer;
   a third wafer comprising a third substrate, a third dielectric layer and a third metal layer, the third dielectric layer and the insulating layer being bonded to each other;
   a second opening penetrating through the third substrate, the third dielectric layer and the insulating layer, the second opening exposing part of the first interconnection layer and part of the third metal layer; and
   a second interconnection layer, electrically connected with the third metal layer and the first interconnection layer via the second opening.

2. The multi-wafer stacking structure of claim 1, wherein the first opening comprises:
   a first lower opening penetrating through the first substrate, the first dielectric layer and the partial thickness of the second dielectric layer, the first lower opening being located above the second metal layer and exposing part of the second metal layer; and
   a first upper opening penetrating through the first substrate and a partial thickness of the first dielectric layer, the first upper opening exposing part of the first metal layer,
   wherein the first lower opening is communicated with the first upper opening to form the first opening.

3. The multi-wafer stacking structure of claim 1, wherein the second opening comprises:
   a second lower opening penetrating through the third substrate, the third dielectric layer and the insulating layer, the second lower opening being located above the first interconnection layer and exposing part of the first interconnection layer; and
   a second upper opening penetrating through the third substrate and a partial thickness of the third dielectric layer, the second upper opening exposing part of the third metal layer,
   wherein the second lower opening is communicated with the second upper opening to form the second opening.

4. The multi-wafer stacking structure of claim 1, wherein: the first dielectric layer comprises a first portion and a second portion; the first metal layer is embedded between the first portion and the second portion of the first dielectric layer; the second dielectric layer comprises a first portion and a second portion; the second metal layer is embedded between the first portion and the second portion of the second dielectric layer; the third dielectric layer comprises a first portion and a second portion; and the third metal layer is embedded between the first portion and the second portion of the third dielectric layer.

5. The multi-wafer stacking structure of claim 4, wherein the first wafer further comprises a passivation layer, wherein the passivation layer is located between the first metal layer and the second portion of the first dielectric layer.

6. The multi-wafer stacking structure of claim 4, wherein the second wafer further comprises a second etching stopping layer, wherein the second etching stopping layer is located between the second metal layer and the second portion of the second dielectric layer.

7. The multi-wafer stacking structure of claim 4, wherein the third wafer further comprises a passivation layer, wherein the passivation layer is located between the third metal layer and the second portion of the third dielectric layer.

8. A fabrication method of the multi-wafer stacking structure of claim 1, comprising:
   providing the first wafer and the second wafer which are bonded to each other, wherein the first dielectric layer faces the second dielectric layer;
   forming the first opening;
   forming the first interconnection layer;
   forming the insulating layer on the surfaces of the first substrate and the interconnection layer;

providing the third wafer;

forming the second opening; and forming the second interconnection layer.

9. The fabrication method of the multi-wafer stacking structure of claim 8, wherein the step of forming a first opening comprises:

forming a first lower opening, wherein the first lower opening penetrates through the first substrate, the first dielectric layer and the partial thickness of the second dielectric layer, wherein the first lower opening is located above the second metal layer and exposes part of the second metal layer; and forming a first upper opening, wherein the first upper opening penetrates through the first substrate and a partial thickness of the first dielectric layer, the first upper opening exposing part of the first metal layer;

wherein the first lower opening is communicated with the first upper opening to form the first opening.

10. The fabrication method of the multi-wafer stacking structure of claim 9, after forming the first lower opening and before forming the first upper opening, further comprising:

forming a filling layer, wherein the first lower opening is filled with the filling layer; and performing a re-etching process to thin the filling layer until an upper surface of the filling layer is not lower than an upper surface of the first metal layer.

11. The fabrication method of the multi-wafer stacking structure of claim 10, wherein the filling layer comprises a bottom anti-reflective coating.

12. The fabrication method of the multi-wafer stacking structure of claim 8, wherein the step of forming the first interconnection layer comprises:

performing an electroplating process to form the first interconnection layer, wherein the first opening is filled with the first interconnection layer and the surface of the first substrate is covered by the first interconnection layer; and performing a chemical and mechanical polishing process to remove the interconnection layer on the surface of the first substrate and perform a surface planarization treatment.

13. The fabrication method of the multi-wafer stacking structure of claim 8, wherein after the first dielectric layer and the second dielectric layer are bonded to each other, the first wafer and/or the second wafer are thinned; and wherein after the third dielectric layer and the insulating layer are bonded to each other, the third wafer is thinned.

* * * * *